(12) United States Patent
Yacout et al.

(10) Patent No.: US 10,276,268 B2
(45) Date of Patent: Apr. 30, 2019

(54) COATING OF NUCLEAR FUEL CLADDING MATERIALS, METHOD FOR COATING NUCLEAR FUEL CLADDING MATERIALS

(71) Applicants: A. M. Yacout, Naperville, IL (US);
Michael J. Pellin, Naperville, IL (US);
Michael Billone, Naperville, IL (US)

(72) Inventors: A. M. Yacout, Naperville, IL (US);
Michael J. Pellin, Naperville, IL (US);
Michael Billone, Naperville, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 908 days.

(21) Appl. No.: 14/017,096

(22) Filed: Sep. 3, 2013

(65) Prior Publication Data
US 2015/0063523 A1    Mar. 5, 2015

(51) Int. Cl.
| G21C 3/00 | (2006.01) |
| G21C 3/20 | (2006.01) |
| G21C 3/07 | (2006.01) |
| G21C 21/02 | (2006.01) |
| C23C 16/40 | (2006.01) |
| C23C 16/455 | (2006.01) |

(52) U.S. Cl.
CPC .............. *G21C 3/20* (2013.01); *C23C 16/403* (2013.01); *C23C 16/405* (2013.01); *C23C 16/45529* (2013.01); *C23C 16/45555* (2013.01); *G21C 3/07* (2013.01); *G21C 21/02* (2013.01); *Y02E 30/40* (2013.01)

(58) Field of Classification Search
CPC ... G21C 3/00; G21C 3/06; G21C 3/07; G21C 3/20
See application file for complete search history.

(56) References Cited

U.S. PATENT DOCUMENTS

| 5,182,077 A | * | 1/1993 | Feinroth | .................. G21C 3/07 |
| | | | | 376/414 |
| 6,813,329 B1 | | 11/2004 | Byers et al. | |
| 8,084,087 B2 | | 12/2011 | Bent et al. | |
| 8,318,248 B2 | | 11/2012 | Elam et al. | |
| 2006/0039524 A1 | * | 2/2006 | Feinroth | ............... C04B 35/806 |
| | | | | 376/409 |
| 2006/0243358 A1 | * | 11/2006 | Colburn | .................. C22C 16/00 |
| | | | | 148/672 |
| 2008/0274282 A1 | | 11/2008 | Bent et al. | |
| 2009/0022259 A1 | | 1/2009 | Gray et al. | |
| 2012/0051489 A1 | * | 3/2012 | Varanasi | ............... F28F 13/182 |
| | | | | 376/424 |
| 2012/0263876 A1 | | 10/2012 | Haukka et al. | |

FOREIGN PATENT DOCUMENTS

WO        02/086994        10/2002

* cited by examiner

*Primary Examiner* — Marshall P O'Connor
(74) *Attorney, Agent, or Firm* — Cherskov Flaynik & Gurda, LLC

(57) ABSTRACT

The invention provides a nuclear reactor cladding, wherein at least one layer of coating is deposited on the exterior surface of the cladding. A nuclear reactor cladding, wherein at least one layer of coating is deposited on the interior surface of the cladding. A method of coating a nuclear reactor cladding, with the steps of selecting the cladding and depositing at least one layer of a first coating on the cladding.

19 Claims, 3 Drawing Sheets

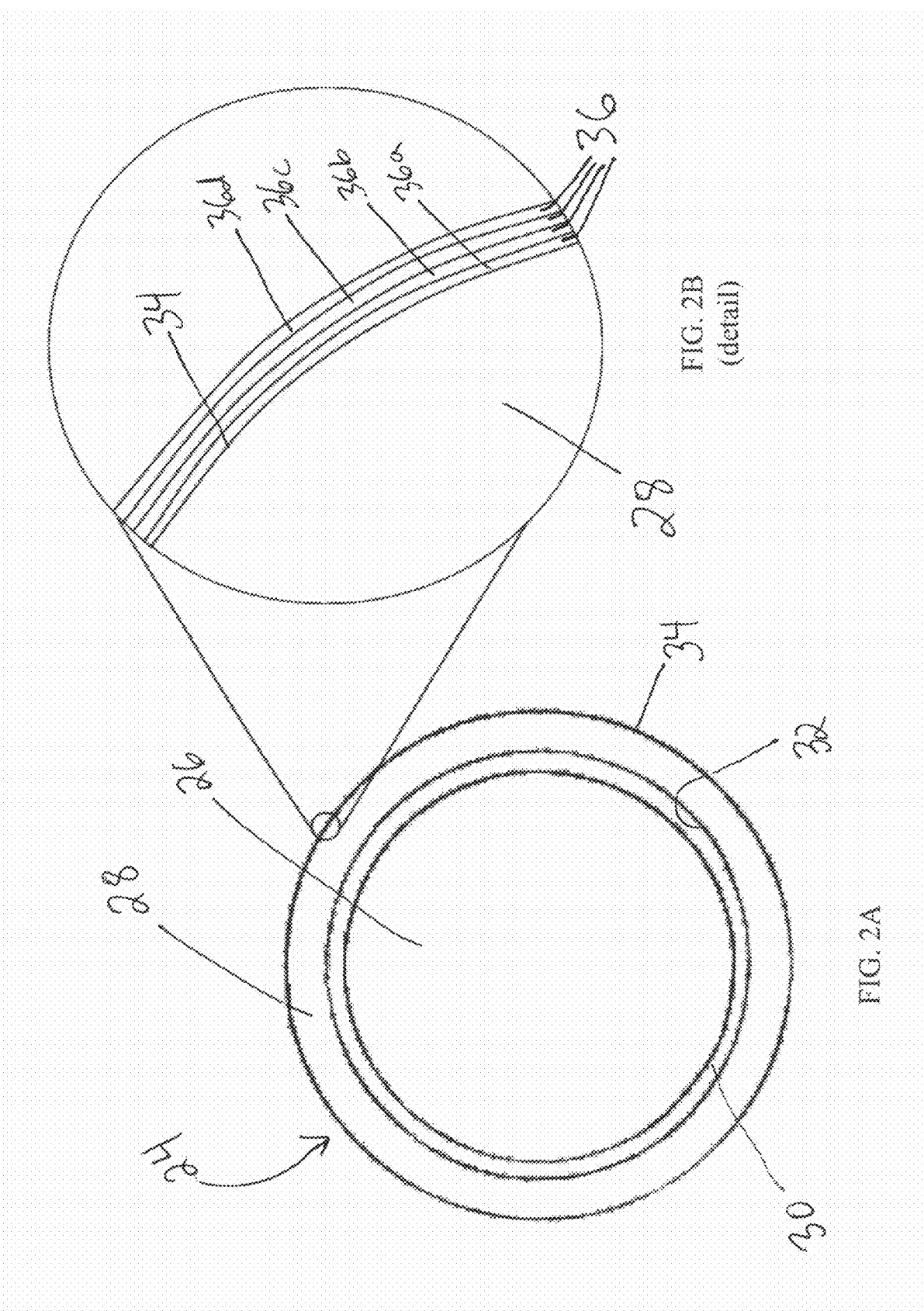

COATING OF NUCLEAR FUEL CLADDING MATERIALS, METHOD FOR COATING NUCLEAR FUEL CLADDING MATERIALS

CONTRACTUAL ORIGIN OF THE INVENTION

The United States Government has rights to this invention pursuant to Contract No. DE-AC02-06CH11357 between the United States Government and UChicago Argonne, LLC representing Argonne National Laboratory.

BACKGROUND OF THE INVENTION

1. Field of the Invention

The present invention relates to nuclear reactor cladding and more specifically the invention relates to coatings to nuclear reactor cladding which provide wear- and chemical-resistance.

2. Background of the Invention

According to EPA statistics, emissions from energy-related activities account for 85.5 percent of the United States' total greenhouse gas emissions. Approximately 80 percent of these energy-related emissions were from the combustion of fossil fuels.

Nuclear energy offers a viable alternative to fossil fuels in that it is comparatively clean. Unfortunately, the public is wary of nuclear energy given the high-profile containment breaches of Three Mile Island in 1979, Chernobyl in 1986, and Fukushima, Japan in 2011. In order to change the public perception of nuclear energy, the safety of nuclear reactors must be assured.

A typical light water reactor (LWR) utilizes the energy produced from fission reactions to heat water or steam infiltrating the reactor core. A simplified representation of a nuclear reactor core can be seen in FIG. 1A. The reactor core 20 contains a plurality of control rods 22 and fuel rods 24. The control rods 22 are made of highly neutron absorbent materials, such as silver, indium, hafnium, boron, and cadmium. The fuel rods 24 comprise fissile material encapsulating in a cladding. Depending on the power production needs, the control rods 22 are inserted or removed so as to moderate the flux of neutrons available for fission reactions.

The energy produced in the fission reactions heats the coolant in the reactor core. For example, in a boiling water reactor, the steam produced in the reactor core heats a secondary loop which in turn spins downstream turbines to produce mechanical energy or motion.

In a pressurized water reactor, the reactor vessel is pressurized to prevent the heated water from turning into steam. The pressurized water travels through a heat exchanger to vaporize clean water (in a secondary water loop) to steam. This steam powers downstream turbines. The mechanical energy from the turbines turns a generator, which results in the production of electricity. In both boiling water and pressurized water reactors, the steam exiting the turbines is cooled by a condenser before being rerouted through the secondary loop in the reactor core.

Fuel cladding is the most important of the three radioactivity barriers existing in nuclear reactors. (The other two are the pressurized vessel and reactor containment structure.) As long as the fuel cladding remains intact during an accident, no threat to public health and safety is expected.

FIG. 1B is a detailed view of a section of one of the fuel rods 24. As can be seen in FIG. 1B, the fuel rods 24 contain the fissile material, typically in the form of fuel pellets 26. In a typical LWR, the fuel pellets 26 are a sintered oxide, predominantly uranium dioxide. Surrounding the fuel pellets 26 is a cladding layer 28, which is typically made of zirconium or a zirconium alloy.

The cladding 28 is primarily responsible for enclosing, encapsulating and otherwise physically isolating the radioactive fuel from areas exterior from the cladding. For this purpose, zirconium has exceptional properties, including low-neutron absorption, high hardness, ductility, and corrosion resistance. Zirconium alloys typically contain greater than 95% zirconium with the balance being other metals, such as tin, niobium, iron, chromium, and nickel. However, zirconium's properties degrade as temperatures reach approximately 800° C., which can happen after a loss-of-coolant-accident (LOCA). The zirconium will react with the coolant water or steam and form an oxide, which produces hydrogen gas. Not only does the presence of hydrogen gas increase the risk of an explosion, but it also causes hydrogen embrittlement. The hydrogen embrittlement leads to blistering and cracking of the cladding 28, providing openings through which radioactive materials can escape.

The water or steam in the reactor core is part of a closed loop (the primary loop) that does not mix with, or contaminate, the water circulating in the condenser (the secondary loop). Maintaining this separation of primary loop water and secondary loop water is critical to the operation of a nuclear power plant. However, contamination of the clean water can happen through a variety of albeit dramatic circumstances. Meltdown, in particular, can lead to a severe breach of containment. A meltdown occurs when a reactor core component melts, exposing uncontaminated coolant to radioactive contaminants.

A core meltdown takes place in six stages:
1. The core is "uncovered," which means that the fuel rods are no longer being covered by coolant. Absent coolant, the fuel rods begin to heat up. Core exposure can happen through a LOCA.
2. The reactor core undergoes pre-damage heat up, whereby temperatures increase at a rate of 0.3° C./s to 1° C./s (degrees Celsius per second).
3. When temperatures reach approximately 1100 K, the zirconium cladding around the fuel rods will begin to expand (i.e., balloon out) and eventually burst. Ballooning takes place because the pressure inside the fuel rod is much greater than outside the fuel rod. As temperature is increased the requisite pressure differential and time to bursting are significantly decreased. Because the fuel rods are closely bundled, the ballooning can lead to a blockage of coolant flow between the rods, further exacerbating the overheating. If the zirconium cladding bursts, then radioactive materials may escape.
4. At approximately 1500 K, the zirconium cladding will undergo rapid oxidation by reacting with the ambient high pressure steam. The oxidation of zirconium will strip the oxygen from the steam, producing hydrogen gas. Excess hydrogen gas causes embrittlement and hydrogen explosions. The disaster in Fukushima, Japan involved a hydrogen explosion that blew the roof off the reactor buildings.
5. As temperatures continue to rise, components of the core will become molten and begin to flow to the lower region of the fuel rods. At this stage, the uranium dioxide fuel pellets, or any of the other fuel materials, will have at least partially dissolved into the zirconium cladding.
6. The final stage of meltdown occurs when the molten reactor core components, including melted fuel pellets, forms a lava-like mixture, referred to as corium, and flows to the bottom of the reactor vessel, or the lower plenum. Water will still be present in the lower plenum, and the flow of the corium into the water will generate large amounts of steam, potentially triggering a steam explosion. Further, the corium can melt through the lower plenum, resulting in the escape of radioactive material.

A need exists in the art for increasing the temperature and chemical resistance of existing nuclear fuel cladding materials. The method should result in claddings resistant to ballooning, bursting and rapid oxidation. The method should yield cladding which does not require decades of certification but rather can be put into service in a short period of time and with no retrofit to existing reactor cores.

SUMMARY OF THE INVENTION

An object of the present invention is to provide nuclear fuel cladding that overcomes many of the drawbacks of the prior art. Specifically the invention provides for uniform, conformal, and pinhole-free coatings that resist oxidation and wearing. Further, atomic layer deposition (ALD) proposed for coating the cladding allows the practicer to coat the entire fuel rod cladding, inside and out, with multiple layers of such coatings while also enhancing material properties.

Another object of the present invention is to improve the corrosion and wear resistance of nuclear reactor claddings. A feature of the present invention is the imposition of multiple layers of different coatings onto a surface or a plurality of surfaces of the cladding. An advantage of the present invention is that the different coatings can be tailored to specific types of wear and corrosion prevention.

Another object of the present invention is to provide nuclear fuel cladding that better withstands rapid oxidation in instances of loss of coolant accidents (LOCA) compared to existing art. A feature of the present invention is that the cladding has a coating of a material that prevents or delays oxygen from diffusing into the zirconium cladding. An advantage of the present invention is that the oxygen diffusion barrier prevents or delays hydrogen gas production after a LOCA, and therefore prevents explosion hazards.

Yet another object of the present invention is to provide a defect-free coating on nuclear fuel claddings. A feature of the present invention is the absence of pin-hole defects through which corrosion can affect cladding. An advantage of the invention is that mechanical stresses are minimized by the layered structure.

Still another object of the present invention is to minimize chemical interactions between nuclear fuel and nuclear fuel cladding. A feature of the present invention is isolating an interior surface (i.e., surfaces which physically contact fuel pellets) of the cladding with a film or a plurality of films. An advantage of the present invention is the prevention or delay of fuel dissolution into the cladding at temperatures in the range of 300-1700K, and preferably between about 750 and about 1500K where uncoated fuel rods experience ballooning and bursting and rapid oxidation.

Another object of the present invention is to provide nuclear fuel claddings resistant to chemical and temperature degradation. A feature of the invention is that substantially all surfaces of the cladding are coated uniformly at any aspect ratio defined by the surface. An advantage is that coatings applied to cladding surfaces proximal to fuel pellets minimize fuel cladding interactions while coatings applied to cladding surfaces exposed to cooling water will minimize fretting, wear, and hydrogen gas production during accident conditions.

Yet another object of the present invention is to improve the chemical and temperature resistance of existing nuclear fuel claddings. A feature of the present invention is the imposition of thin film, elastic layers on complex surfaces of the claddings, such as surfaces with widely varying aspect ratios. A further feature is that adding multiple layers of thin films creates an additive effect on the elasticity of the coating. An advantage of the present invention is that a plurality of thin layers withstands thermal stresses better than one or two thick layers when exposed to rapid heating.

The present invention provides a nuclear reactor cladding, wherein at least one layer of coating is deposited on the exterior surface of the cladding.

The present invention also provides a nuclear reactor cladding, wherein at least one layer of coating is deposited on the interior surface of the cladding.

Further, the present invention provides a method of coating a nuclear reactor cladding, said method comprising the steps of selecting a cladding and depositing at least one layer of a first coating upon the cladding.

BRIEF DESCRIPTION OF THE DRAWINGS

The invention together with the above and other objects and advantages will be best understood from the following detailed description of the preferred embodiment of the invention shown in the accompanying drawings, wherein:

FIG. 2A is plan-view of a cutaway of a fuel rod in accordance with the features of the present invention;

FIG. 2B is a detail view of the coating on the cladding in accordance with the features of the present invention;

DETAILED DESCRIPTION OF THE INVENTION

Figures 1A, 1B:
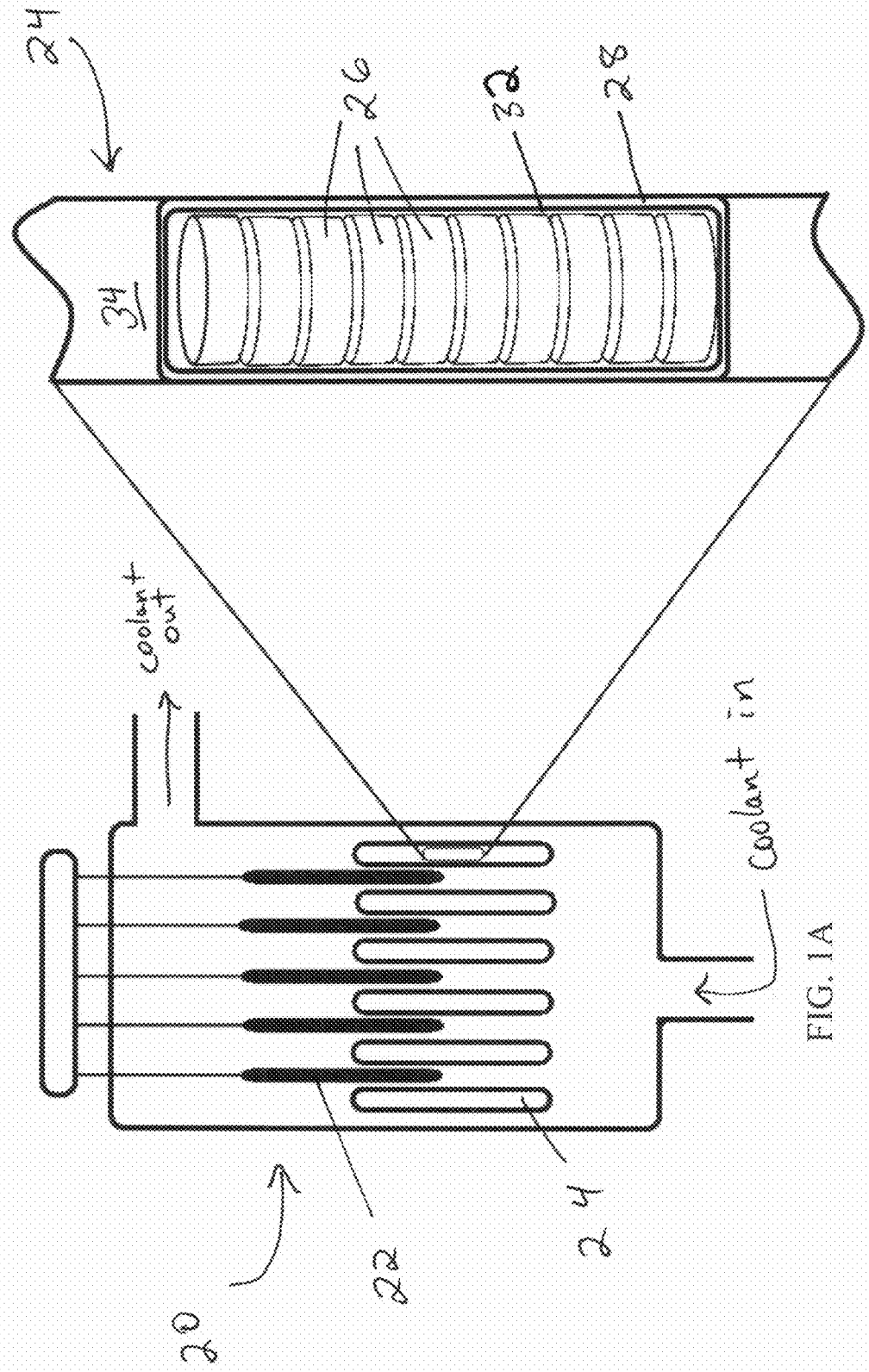
FIG. 1A is a depiction of a nuclear reactor core.
FIG. 1B is a detail view of FIG. 1A.

The foregoing summary, as well as the following detailed description of certain embodiments of the present invention, will be better understood when read in conjunction with the appended drawings.

As used herein, an element step recited in the singular and preceded with the word "a" or "an" should be understood as not excluding plural said elements or steps, unless such exclusion is explicitly stated. Furthermore, the references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

This invention improves upon currently used, nuclear fuel claddings in nuclear reactors. In an embodiment of the invention, atomic layer deposition (ALD) is utilized to deposit one or a plurality of layers on the interior and/or exterior surfaces of the cladding. The coatings can be selected to improve specific mechanical and chemical properties of the already existing and in-stock zirconium-based cladding.

In the six-stages of meltdown discussed supra, stages three and four relate to cladding failures. This highlights the importance of the cladding 28 in containing the radioactive fuel. The present invention helps to maintain the integrity of the cladding 28 by adding coatings to the interior and/or exterior surfaces.

FIG. 2A shows a plan view of a cutaway section of a fuel rod 24. The fuel pellet 26 is surrounded by an expansion gap 30 and the cladding 28, wherein the expansion gap is positioned between the pellet and the cladding. The cladding 28 has an interior, medially facing surface 32 and an exterior laterally facing surface 34. FIG. 2B shows a detail view of the exterior surface 34. The exterior cladding surface 34 is coated with a plurality of layers 36, which are deposited via ALD. Individual layers can be from 1 to 1,000 nm in thickness. A total thickness of 1,000 nm is envisioned, but greater thicknesses are possible. The coating layers 36 can consist of a single layer 1,000 nm thick or multiple layers of approximately 10-15 nm in thickness deposited until a total thickness of up to 1,000 nm is reached. Each of the layers may be the same thickness or different thicknesses.

ALD is a sequential, self-limiting synthesis technique that allows conformal coating of large areas and complex shapes. ALD is sequential because alternating precursors are introduced to the substrate, forming a layer over the substrate one atom or molecule thick. The second precursor is introduced, which reacts with the first precursor, again forming another layer that is a single atom thick. ALD is self-limiting because the precursors wet the entire substrate surface including those regions not in line of sight. When the second precursor is introduced, the reaction with the first precursor proceeds until there is no available reaction area. The remainder of the precursor is pumped away after each precursor application.

In the present invention, a single layer 36 or a plurality of layers 36a, 36b, 36c can be deposited. The layers 36 can be deposited on the interior surface 32, the exterior surface 34, or both. Further, the deposited layers 36 can be the same on the interior surface 32 and exterior surface 34, or the deposited layers 36 can be different on the interior surface 32 than the layers 36 on the exterior surface 34. Furthermore, the layers on the same side of a cladding may comprise different materials so that a first layer on a first side may comprise zirconium nitride, while a second layer overlaying that first layer on the first side may comprise zirconium oxide. The layers 36 can be any material for which suitable precursors exists and that has desirable properties.

For the purposes of description and by way of example, the deposition of a first alumina layer 36a and a second zirconium dioxide layer 36b on the exterior surface 34 will be considered. These coatings have suitable precursors, and both coatings have desirable properties. The alumina layer 36a prevents the rapid oxidation of the zirconium cladding 28 by acting as a barrier to oxygen diffusion into the bulk material. The zirconium dioxide layer 36b protects the alumina layer 36a from high temperature water dissolution as tetragonal zirconium dioxide is insoluble in water.

The combination of alumina and zirconium dioxide provides other unexpected synergistic results. For instance, the water stable tetragonal phase of zirconium dioxide spontaneously forms when deposited on alumina if each layer is approximately 80 nanometers thick. Ordinarily, creating the tetragonal phase would require careful annealing. However, the interfacial strain provided by the invented method between the crystalline structures of the layers controls the zirconium dioxide morphology. Creating the tetragonal zirconium dioxide is aided by adding up to about 3 at % minor impurities, such as yttrium.

Figure 3A:
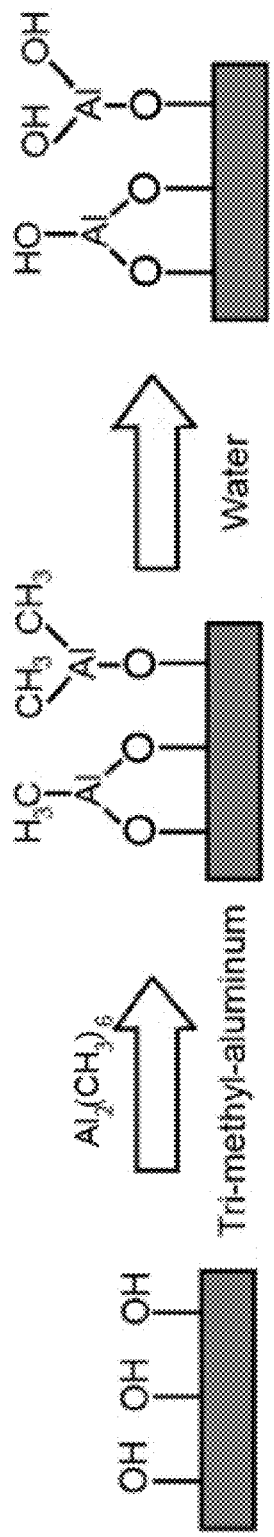
FIG. 3A is a depiction of an exemplary reaction sequence on the surface of the cladding.

FIG. 3A shows a first reaction sequence on the exterior surface 34 to produce an alumina layer 36a, in an embodiment of the invented method. The alumina layer is deposited at a temperature of 100 to 300° C. in an environment of argon and/or nitrogen gas at a combined pressure of 0.001 to 1 atm. The surface of the cladding is prepared by standard surface preparation, which consists of degreasing with trichloroethylene and rinsing with methanol to facilitate attachment (e.g., covalent bonding) of hydroxyl groups to surfaces to be overlaid. Then, a first precursor, such as tri-methyl-aluminum ($Al(CH_3)_3$), is passed over the exterior surface 34. After the tri-methyl-aluminum has had sufficient time to cover and react with the surface (approximately ten seconds), the remainder is evacuated from the reaction environment. The tri-methyl-aluminum reacts with the hydroxyl group creating a bond between the surface oxygen and aluminum. One or two methane leaving groups are produced in the reaction.

Upon creation of the di-methy- or methyl-aluminum moiety, the reaction environment is flushed, replaced, or otherwise neutralized. A suitable replacement means is a relatively inert gas, such as nitrogen, helium, or argon. After reaction environment neutralization, water is then introduced into the atmosphere in an amount and for a time sufficient to react with the remaining methyl groups. The water reaction generates further methane leaving groups, which are substituted by hydroxyl moieties. The reaction environment is then replaced with an inert gas again.

The net result of the reaction sequence is the deposition of alumina layer 36a on the exterior surface 34. After this first reaction sequence, another alumina layer 36b is deposited using the same precursors. Alternatively, a layer 36 of another material is deposited over the first layer.

Figure 3B:
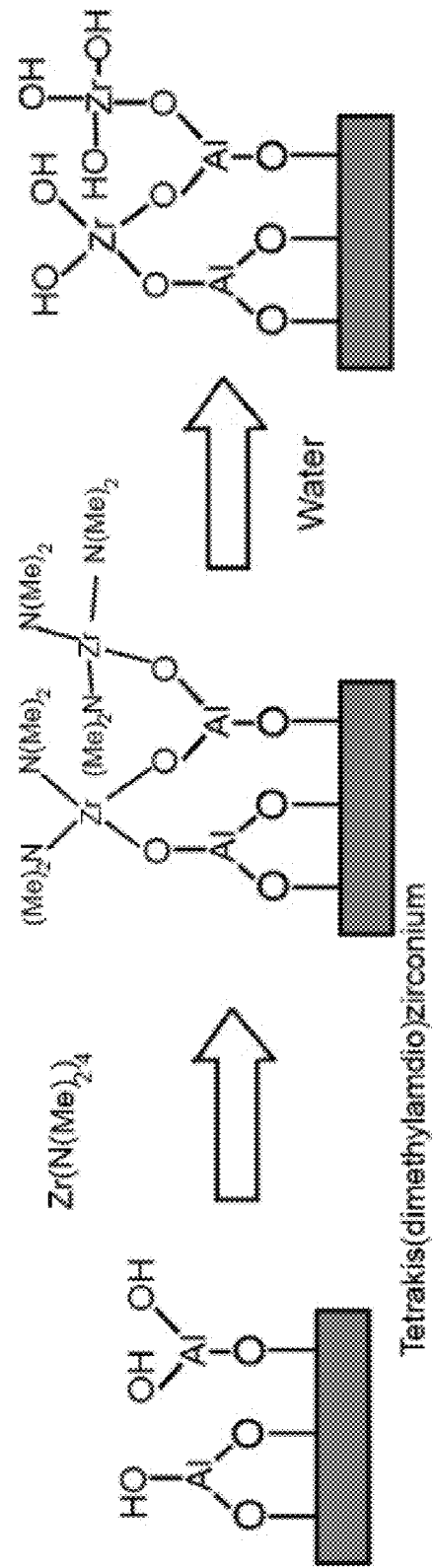
FIG. 3B is a depiction of a second exemplary reaction sequence on the surface of the cladding.

FIG. 3B shows the second ALD reaction sequence of this example. After the initial deposition, hydroxyl moieties on the surface of the just deposited alumina layer 36a provides docking points for moieties contained in second layer constituents. For example, the hydroxyl groups react with the zirconium atom found the second reaction's first precursor, which can be any number of suitable zirconium precursors such as tetrakis(dimethylamido)zirconium. After the second reaction's second precursor, water in this example, is introduced, the net result of the reaction is the deposition of a layer of zirconia 36b. Thus, after two ALD reactions, a two layer coating comprising alumina and zirconia is generated.

At this point, another alumina layer 36c or zirconium dioxide layer 36d could be deposited, but any number of other materials and layers 36 could also be chosen. FIG. 2B shows four deposited layers 36a-d, but the number of layers 36 can be lesser or greater, depending on the desired properties.

Several other materials have properties that would be desirable as coatings on nuclear reactor claddings 28. Some representative examples are: zirconium nitride (ZrN), zirconium hydride ($ZrH_2$), silicon nitride ($Si_3N_4$), silicon dioxide ($SiO_2$), aluminum nitride (AlN), silicon carbide (SiC), gadolinium oxide (GdO), titanium nitride (TiN), magnesium oxide (MgO), calcium oxide (CaO), and elemental zirconium, molybdenum, and silicon. Most of the nitrides and carbides are good for representative examples for coatings. Suitable burnable moieties include $ZrH_2$ and GdO. Molybdenum is a suitable refractory material.

The advantages of depositing these materials via ALD are many. First, ALD can coat the entire fuel cladding inside and out. ALD has been shown to provide uniform coating over surface areas with aspect ratios of 10,000:1, which is important given that fuel rods are up to four meters long and are relatively narrow. Second, the resulting deposited surface is substantially devoid of unwanted artifacts such as pin-hole defects. Such defects are nucleation sites for corrosion and pitting, with the defects expanding due to radiation damage. The elastic thin films of the present invention reduce the effects of radiation damage. Furthermore, the existence of grain boundary sliding at the interface of the applied layers minimizes impact force by neutrons, protons and other particles. Third, ALD provides thin film coatings, which perform better than thick coatings when exposed to thermal stresses. As stated above, ALD deposits layers that are one atom or molecule thick, and the number of layers deposited is easily controlled. Fourth, state of the art claddings would not have to be replaced. Currently used zirconium claddings could simply be coated before going into service, obviating the need for decades of research and testing that would be necessary to vet a replacement material.

EXAMPLES

Tests were run to determine the oxidation resistance provided by various coatings. When a material oxidizes, it gains weight proportionately to the amount of oxidation that occurs. This feature provides a means for determining the extent of cladding damage whereby weight gain due to oxide formation is proportional to cladding damage. Tests measured oxidation weight changes as a function of temperature. All tests were run over a four hour period, with 30 minutes of furnace heat-up and cool-down time, in flowing oxygen gas at atmospheric pressure. Table I, below, summarizes the oxidation of uncoated Zircaloy. The error margin for the oxidation weight gain measurements in all the experimental data is +/−0.005%.

TABLE I

Zircaloy-2 (uncoated)

| Heat Temp (° C.) | Weight Change (%) |
|---|---|
| 300 | 0 |
| 400 | 0.065 |
| 500 | 0.17 |
| 600 | 0.32 |
| 800 | 2.1 |

Table I shows that weight gain in an uncoated Zircaloy sample starts at temperatures at least as low as 400° C.

Table II, below, provides oxidation data for various coatings applied to the Zircaloy.

TABLE II

Oxidation Characteristics for Various Coatings on Zircaloy-2

| Coating | Heat Temp (° C.) | Weight Change (%) | Deposition Temp. (° C.) |
|---|---|---|---|
| Al$_2$O$_3$ | 300 | 0 | 100 and 420 |
| | 400 | 0 | |
| | 500 | 0.005 | |
| | 600 | 0.4 | |
| | 800 | 2.1 | |
| Al$_2$O$_3$/ZrO$_2$ | 300 | 0 | 375 |
| | 400 | 0 | |
| | 500 | 0.005 | |
| | 600 | 0.28 | |
| SiO$_2$ | 300 | 0 | 350 |
| | 400 | 0 | |
| | 500 | 0.1 | |
| | 600 | 0.36 | |
| SiO$_2$/Al$_2$O$_3$/ZrO$_2$ | 300 | 0 | 300 |
| | 400 | 0 | |
| | 500 | 0 | |
| | 550 | 0 | |
| | 600 | 0.09 | |

Table II shows that even single layer coatings increased the temperature at which oxidation began to occur. The tests also suggested a correlation between the temperature of oxidation onset and the temperature of deposition in that a higher deposition temperature delayed the onset of oxidation.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

The present methods can involve any or all of the steps or conditions discussed above in various combinations, as desired. Accordingly, it will be readily apparent to the skilled artisan that in some of the disclosed methods certain steps can be deleted or additional steps performed without affecting the viability of the methods.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The embodiment of the invention in which an exclusive property right or privilege is claimed is defined as follows:

1. A nuclear reactor cladding, wherein a coating is deposited at a temperature between 100° C. and 300° C. via atomic layer deposition on the exterior surface of the cladding, wherein the coating is elastic and contains tetragonal phase zirconium dioxide, and wherein the cladding comprises zirconium alloy, and wherein the coating is applied at temperatures lower than temperatures that cause weight gain in the cladding.

2. The cladding of claim 1 wherein the coating comprises multiple layers of materials, the multiple layers comprising at least a first coating layer of alumina and a second coating layer of a combination of zirconium oxide and silicon dioxide.

3. The cladding of claim 1, wherein the coating is multiple layers of a variety of coating materials.

4. The cladding of claim 3, wherein the variety of coating materials is a metal-containing compound selected from a group consisting of alumina, zirconium oxide, silicon carbide, silicon dioxide, magnesium oxide, zirconium nitride, zirconium hydride, silicon nitride, aluminum nitride, zirconium, molybdenum, silicon, gadolinium oxide, titanium nitride, calcium oxide, and combinations thereof.

5. The cladding of claim 1, wherein the coating is also deposited on an interior surface of the cladding.

6. The cladding of claim 5, wherein the coating on the exterior and interior surfaces is a metal-containing compound selected from the group consisting of alumina, zirconium oxide, silicon carbide, silicon dioxide, magnesium oxide, zirconium nitride, zirconium hydride, silicon nitride, aluminum nitride, zirconium, molybdenum, silicon, gadolinium oxide, titanium nitride, calcium oxide, and combinations thereof.

7. The cladding of claim 6, wherein the exterior surface and interior surface are coated with different coatings.

8. A nuclear reactor cladding, wherein at least one layer of coating is deposited on the interior surface of the cladding at a temperature between 100° C. and 300° C. via atomic layer deposition, wherein the coating is elastic and contains tetragonal phase zirconium dioxide, and wherein the cladding comprises zirconium alloy, and wherein the coating is applied at temperatures lower than temperatures that cause weight gain in the cladding.

9. The cladding of claim 8, wherein the at least one layer of coating is a metal-containing compound selected from a group consisting of alumina, zirconium oxide, silicon carbide, silicon dioxide, magnesium oxide, zirconium nitride, zirconium hydride, silicon nitride, aluminum nitride, zirconium, molybdenum, silicon, gadolinium oxide, titanium nitride, calcium oxide, and combinations thereof.

10. The cladding of claim 9, wherein the at least one layer of coating comprises multiple layers of compounds.

11. The cladding of claim 10, wherein the coating materials are metal-containing compounds selected from a group consisting of alumina, zirconium oxide, silicon carbide, silicon dioxide, magnesium oxide, zirconium nitride, zirconium hydride, silicon nitride, aluminum nitride, zirconium, molybdenum, silicon, gadolinium oxide, titanium nitride, calcium oxide, and combinations thereof.

12. The cladding of claim 11, wherein the exterior surface and interior surface are coated with different coatings.

13. The cladding of claim 1 wherein the coating is between about 1 and about 1,000 nm thick.

14. The cladding of claim 2 wherein each of the multiple layers is between about 10 and about 15 nm thick.

15. The cladding of claim 2 wherein the total thickness of the multiple layers is about 1,000 nm.

16. The cladding of claim 1 wherein the coating comprises a material selected from a group consisting of alumina, zirconium oxide, silicon carbide, silicon dioxide, magnesium oxide, zirconium nitride, zirconium hydride, silicon nitride, aluminum nitride, zirconium, molybdenum, silicon, gadolinium oxide, titanium nitride, and calcium oxide.

17. The cladding of claim 1 wherein the coating is uniform, conformal, and pinhole-free.

18. A coated nuclear reactor cladding created by the process comprising:
   a) providing a cladding having an interior and exterior surface; and
   b) depositing a coating on the exterior surface of the cladding using atomic layer deposition, wherein the deposited coating is elastic, wherein the cladding comprises zirconium alloy, wherein the coating is deposited at a temperature between 100° C. and 300° C., and wherein the coating contains tetragonal phase zirconium dioxide, and wherein the coating is applied at temperatures lower than temperatures that cause weight gain in the cladding.

19. The coated nuclear reactor cladding of claim 18 wherein the coating comprises multiple layers of materials, the multiple layers comprising at least a first coating layer of alumina and a second coating layer of a combination of zirconium oxide and silicon dioxide.

* * * * *